United States Patent
Kojima et al.

(10) Patent No.: US 12,020,768 B2
(45) Date of Patent: Jun. 25, 2024

(54) SEMICONDUCTOR DEVICE HAVING OUTPUT BUFFER

(71) Applicant: MICRON TECHNOLOGY, INC., Boise, ID (US)

(72) Inventors: Mieko Kojima, Hino (JP); Kazuyuki Morishige, Sagamihara (JP); Tetsuya Arai, Sagamihara (JP); Guangcan Chen, Machida (JP)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 17/563,852

(22) Filed: Dec. 28, 2021

(65) Prior Publication Data

US 2023/0206966 A1 Jun. 29, 2023

(51) Int. Cl.
*G11C 7/10* (2006.01)
*G11C 5/06* (2006.01)
*H03K 19/017* (2006.01)

(52) U.S. Cl.
CPC ............ *G11C 7/1057* (2013.01); *G11C 5/06* (2013.01); *G11C 7/1039* (2013.01); *H03K 19/01721* (2013.01)

(58) Field of Classification Search
CPC ....... G11C 7/1057; G11C 5/06; G11C 7/1039; G11C 5/025; G11C 11/4093; H03K 19/01721; H10B 12/00
See application file for complete search history.

(56) References Cited

U.S. PATENT DOCUMENTS

| | | | | |
|---|---|---|---|---|
| 2008/0112253 A1* | 5/2008 | Youn | ................. | G11C 5/025 365/230.06 |
| 2012/0243286 A1* | 9/2012 | Inaba | ................. | G11C 5/06 365/72 |
| 2015/0348601 A1* | 12/2015 | Onuki | ................. | G11C 29/021 365/72 |
| 2017/0194037 A1* | 7/2017 | Fujiwara | ................. | G11C 11/412 |
| 2017/0256548 A1* | 9/2017 | Hsu | ................. | H01L 27/0207 |
| 2020/0335513 A1* | 10/2020 | Morozumi | ................. | G11C 16/08 |

* cited by examiner

*Primary Examiner* — Jerome Leboeuf
*Assistant Examiner* — Margaret Bailey Hayes
(74) *Attorney, Agent, or Firm* — Dorsey & Whitney LLP (57) ABSTRACT

Disclosed herein is an apparatus that includes a first wiring layer including first and second conductive patterns extending in a second direction and coupled to source and drain regions, respectively, and a second wiring layer including third and fourth conductive patterns extending in the second direction and coupled to the first and second conductive patterns, respectively. The first conductive pattern has first and second sections arranged in the second direction, and the second conductive pattern has third and fourth sections arranged in the second direction. The first and fourth sections are arranged in a first direction, and the second and third sections are arranged in the first direction. The third conductive pattern covers the first section without covering the second section. The fourth conductive pattern covers the third section without covering the fourth section.

11 Claims, 9 Drawing Sheets

SEMICONDUCTOR DEVICE HAVING OUTPUT BUFFER

BACKGROUND

A semiconductor device such as a DRAM (Dynamic Random Access Memory) has a data I/O terminal for inputting and outputting data. It is desired to lower capacitance added to the data I/O terminal to increase a data transfer rate via the data I/O terminal and to reduce current consumption associated with data input/output.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
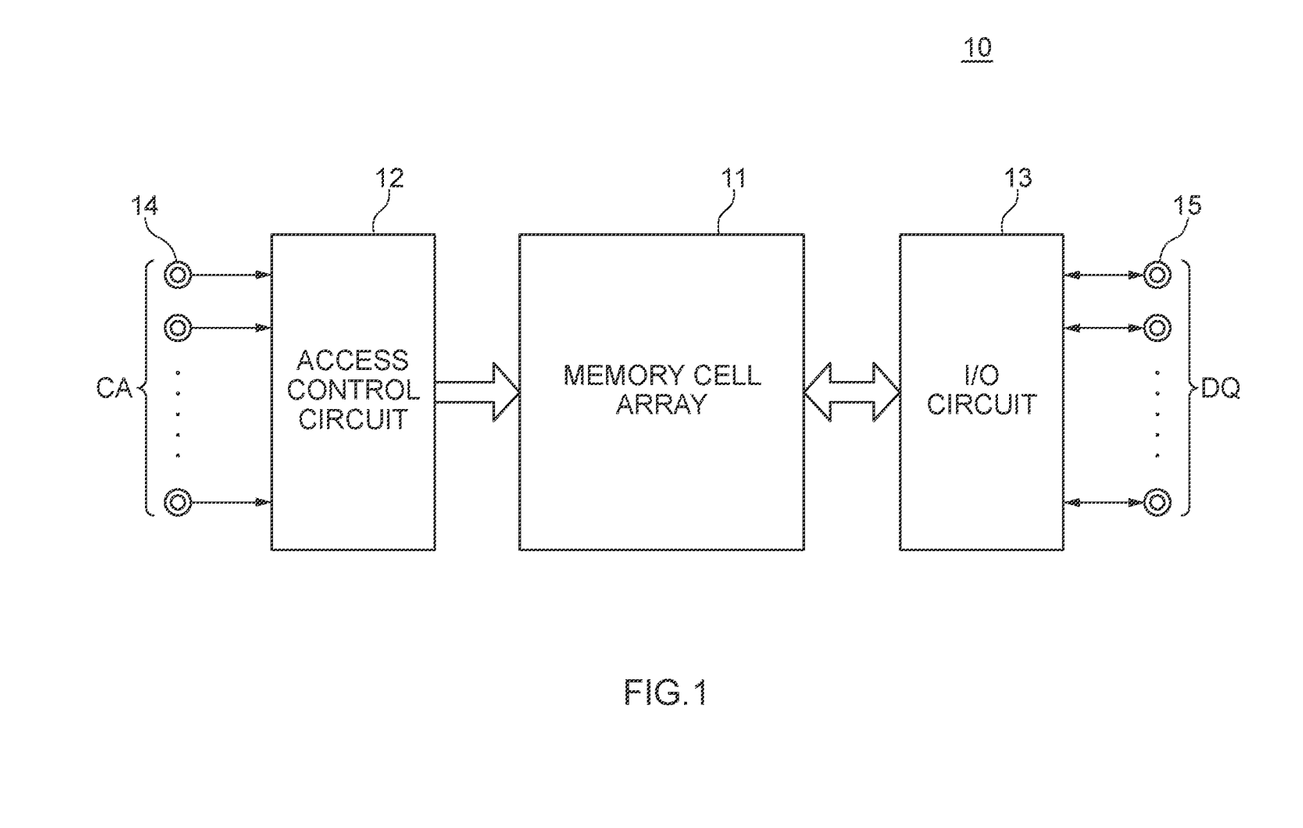
FIG. 1 is a block diagram showing a configuration of a semiconductor device according to an embodiment of the present disclosure.

FIG. 1 is a block diagram showing a configuration of a semiconductor device 10 according to an embodiment of the present disclosure. The semiconductor device 10 shown in FIG. 1 is, for example, a DRAM and includes a memory cell array 11, an access control circuit 12 that performs an access to the memory cell array 11, and an I/O circuit 13 that performs input/output of data to/from the memory cell array 11. The access control circuit 12 performs an access to the memory cell array 11 on the basis of a command address signal CA input from an external controller through a command address terminal 14. At the time of a read operation, data DQ read from the memory cell array 11 is output to a data I/O terminal 15 via the I/O circuit 13. At the time of a write operation, data DQ input to a data I/O terminal 15 from an external controller is written into the memory cell array 11 via the I/O circuit 13.

Figure 2:
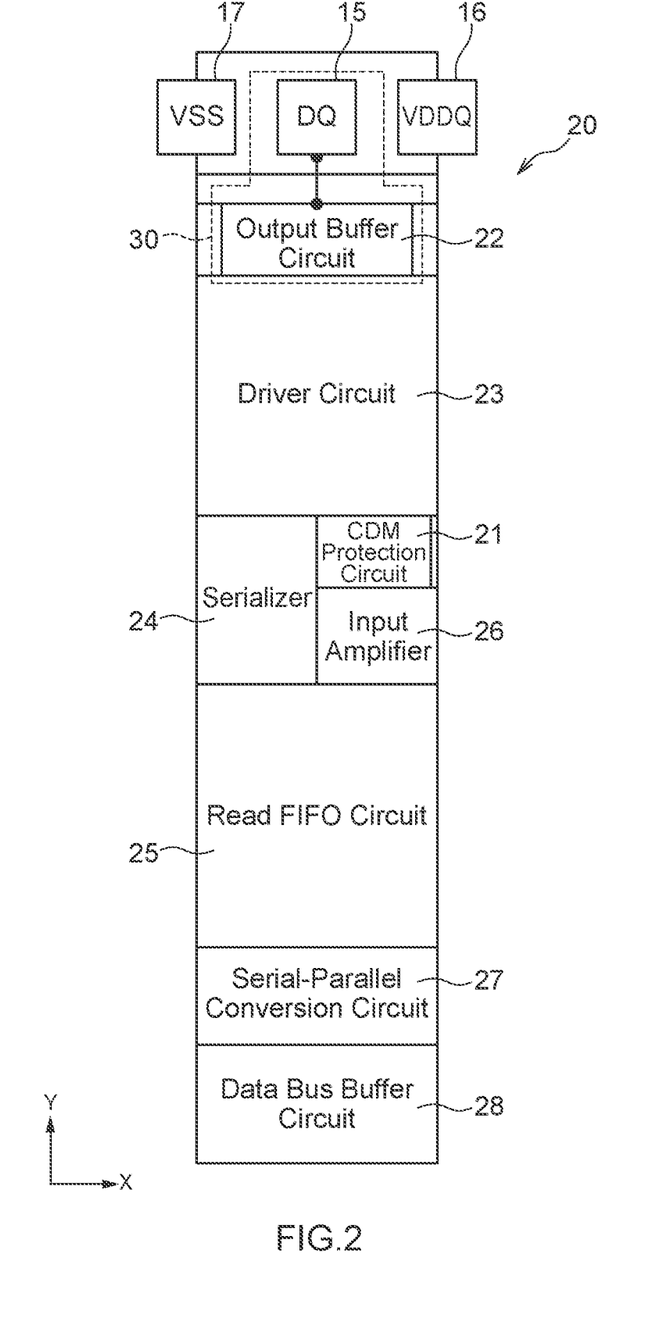
FIG. 2 is a block diagram of a data input/output circuit allocated to a data I/O terminal.

FIG. 2 is a block diagram of a data input/output circuit 20 allocated to each data I/O terminal 15. As shown in FIG. 2, the data input/output circuit 20 includes a CDM protection circuit 21, an output buffer circuit 22, a driver circuit 23, a serializer 24, a read FIFO circuit 25, an input amplifier 26, a serial-parallel conversion circuit 27, and a data bus buffer circuit 28. The CDM protection circuit 21 is a circuit that protects the data input/output circuit 20 from electrostatic discharge damages. The output buffer circuit 22 is a circuit that outputs read data DQ to the data I/O terminal 15 at the time of a read operation. The driver circuit 23 is a circuit that drives the output buffer circuit 22 on the basis of the read data DQ. The serializer 24 is a circuit that converts parallel read data DQ into serial data and supplies the serial data to the driver circuit 23. The read FIFO circuit 25 is a circuit that supplies read data DQ supplied from the memory cell array 11 via a data bus to the serializer 24 at the time of a read operation. The input amplifier 26 is a circuit that receives write data DQ input via the data I/O terminal 15 at the time of a write operation. The serial-parallel conversion circuit 27 is a circuit that converts serial write data DQ output from the input amplifier 26 to parallel data. The data bus buffer circuit 28 is a circuit that outputs the write data DQ converted into parallel data to the data bus. A power supply terminal 16 supplied with a power potential VDDQ and a power supply terminal 17 supplied with a power potential VSS are placed on both sides in an X direction of the data I/O terminal 15, respectively. The X direction and a Y direction are perpendicular. The output buffer circuit 22 operates with a voltage between the power potential VDDQ and the power potential VSS.

Figure 3:
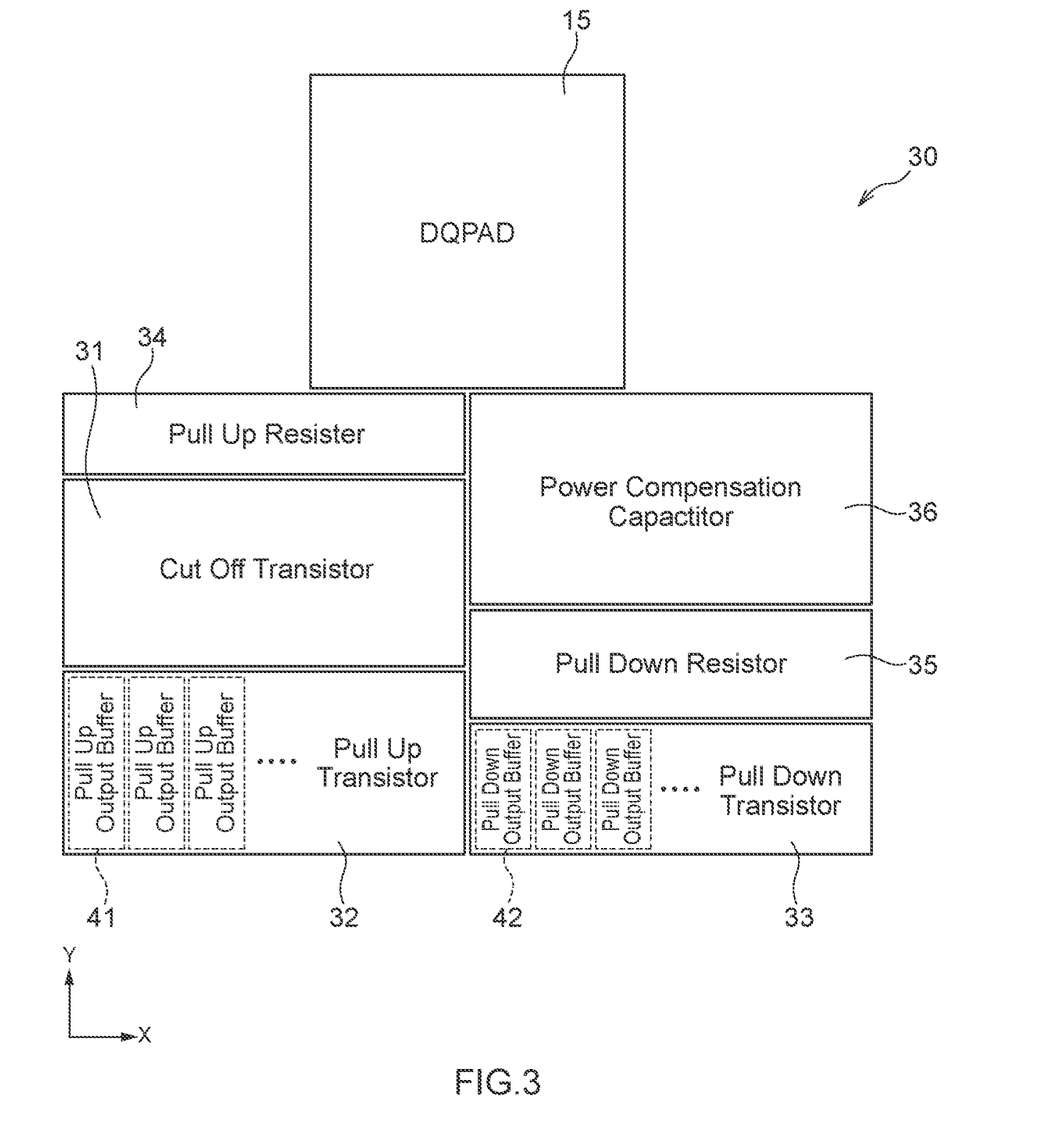
FIG. 3 is a layout diagram of an output buffer circuit.

FIG. 3 is a layout diagram for explaining a layout of a region 30 shown in FIG. 2 in more detail. As shown in FIG. 3, the region 30 in which the output buffer circuit 22 is placed includes a cut off transistor region 31, a pull up transistor region 32, a pull down transistor region 33, a pull up resistor region 34, a pull down resistor region 35, and a power compensation capacitor region 36. A plurality of pull up output buffers 41 arranged in the X direction are placed in the pull up transistor region 32. A plurality of pull down output buffers 42 arranged in the X direction are placed in the pull down transistor region 33. A compensation capacitor for suppressing power supply noise is placed in the power compensation capacitor region 36.

Figure 4:
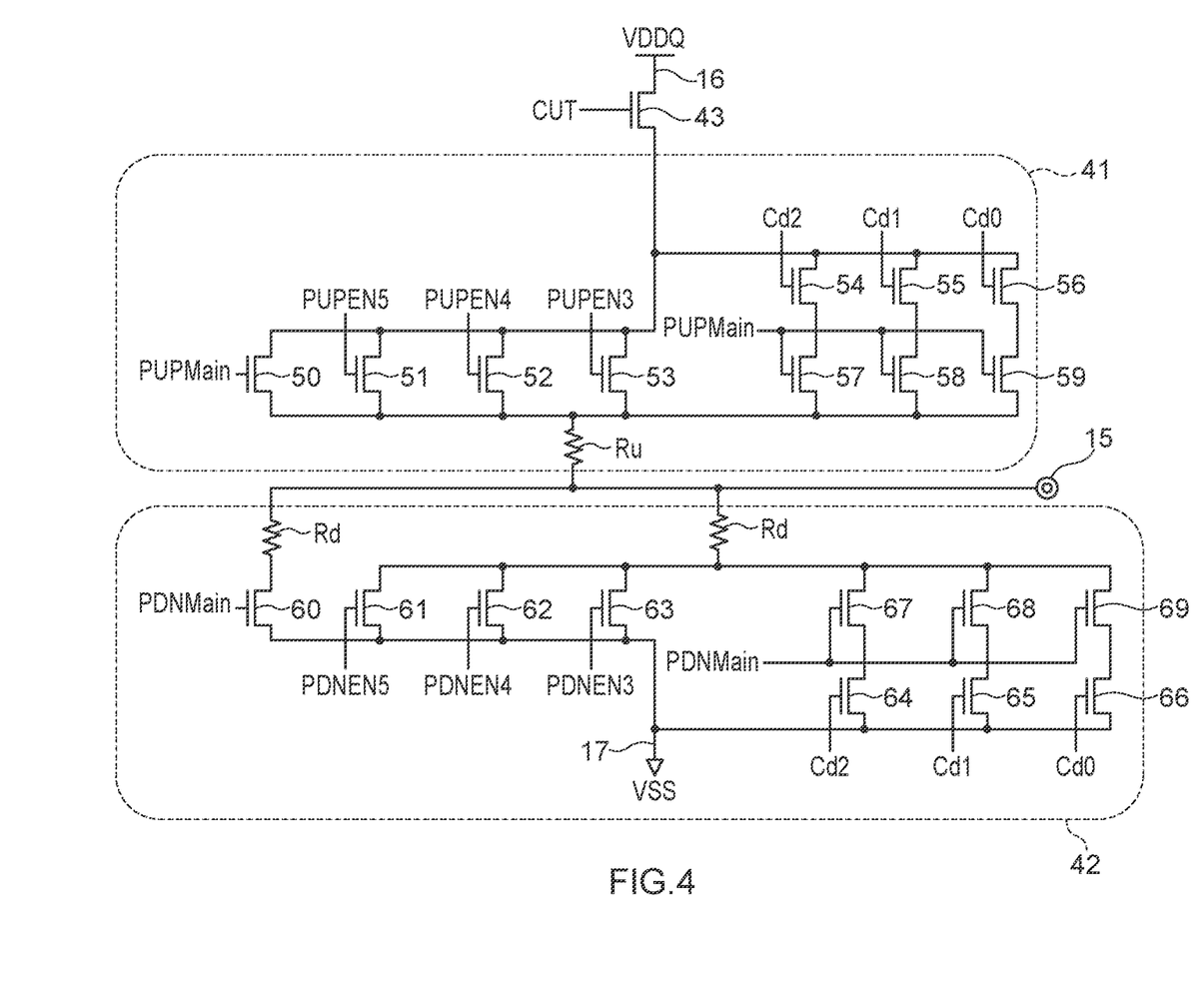
FIG. 4 is a circuit diagram of pull up output buffers and pull down output buffers.

FIG. 4 is a circuit diagram of the pull up output buffers 41 and the pull down output buffers 42. As shown in FIG. 4, each of the pull up output buffers 41 has transistors 50 to 56 coupled in parallel to each other. Transistors 57 to 59 are coupled in series to the transistors 54 to 56, respectively. While the transistors 50 to 59 are N-channel MOS transistors in the example shown in FIG. 4, it is also possible to use P-channel MOS transistors. Drains of the transistors 50 to 56 are coupled to the power supply terminal 16 via a cutoff transistor 43. Sources of the transistors 50 to 53 and 57 to 59 are coupled to the data I/O terminal 15 via a pull up resistor Ru. A cutoff signal CUT is supplied to a gate electrode of the cutoff transistor 43. The cutoff signal CUT is deactivated during a period in which read data is not output, and the current consumption is accordingly reduced. Each of the pull down output buffers 42 has transistors 60 to 66 coupled in parallel to each other. Transistors 67 to 69 are coupled in series to the transistors 64 to 66, respectively. Sources of the transistors 60 to 66 are coupled to the power supply terminal 17. Drains of the transistors 60 to 63 and 67 to 69 are coupled to the data I/O terminal 15 via a pull down resistor Rd.

Pull up signals PUPMain, PUPEN5, PUPEN4, PUPEN3, Cd2, Cd1, and Cd0 are supplied to gate electrodes of the transistors 50 to 56, respectively. The pull up signal PUPMain is a signal that is always activated when high-level read data is to be output. The pull up signals PUPEN5, PUPEN4, PUPEN3, Cd2, Cd1, and Cd0 are signal for adjusting the capability of the pull up output buffer 41 and whether to activate these signals when high-level read data is output is determined according to a parameter set in a mode register. The pull up signal PUPMain is supplied to gate electrodes of the transistors 57 to 59. Pull down signals PDNMain, PDNEN5, PDNEN4, PDNEN3, Cd2, Cd1, and Cd0 are supplied to gate electrodes of the transistors 60 to 66, respectively. The pull down signal PDNMain is a signal that is always activated when low-level read data is to be output. The pull down signals PDNEN5, PDNEN4, PDNEN3, Cd2, Cd1, and Cd0 are signals for adjusting the capability of the pull down output buffer 42 and whether to activate these signals when low-level read data is output is determined according to a parameter set in the mode register. The pull down signal PDNMain is supplied to gate electrodes of the transistors 67 to 69.

Figure 5:
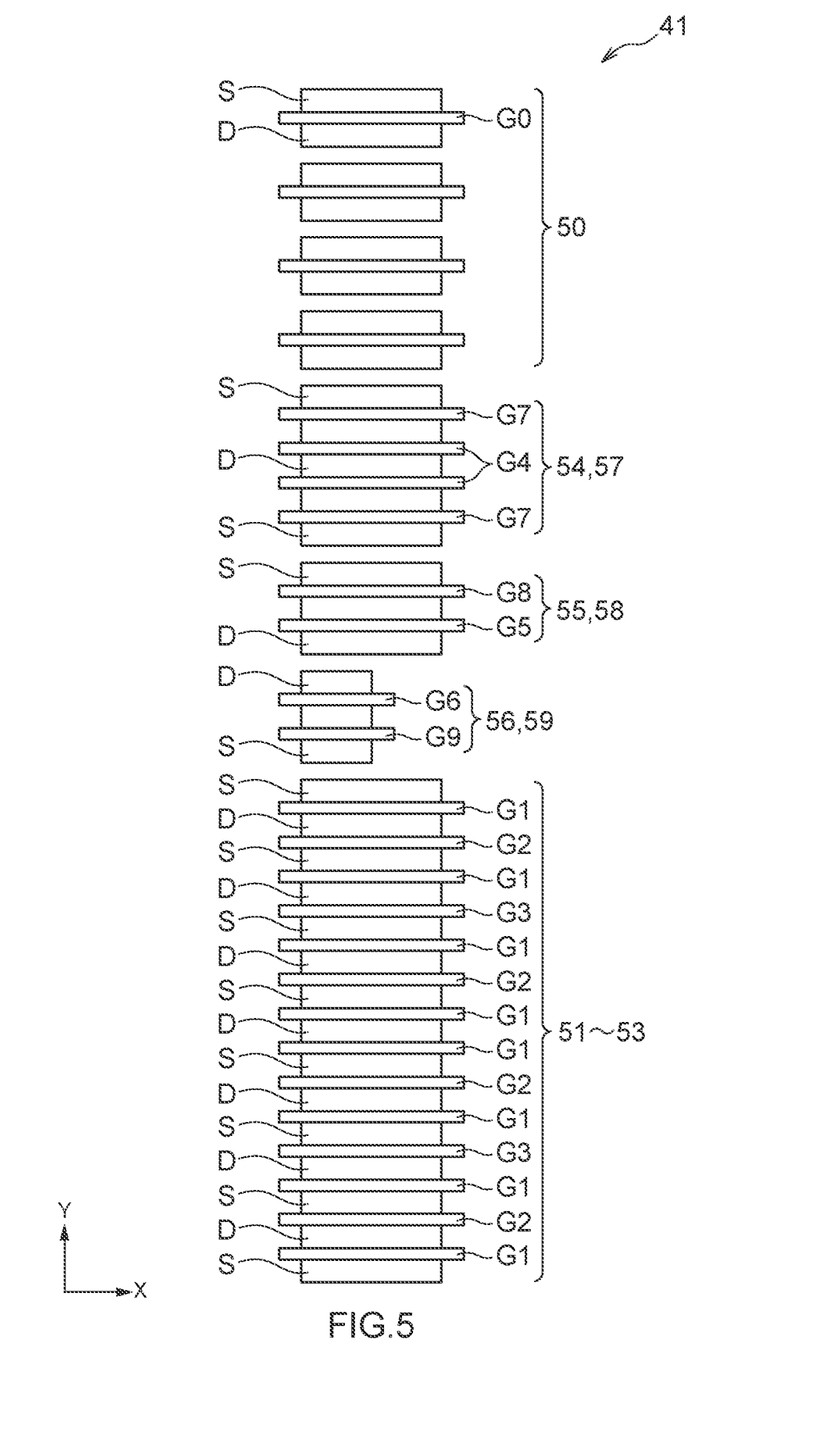
FIG. 5 is a layout diagram of transistors constituting a pull up output buffer.

FIG. 5 is a layout diagram of the transistors 50 to 59 constituting each of the pull up output buffers 41. As shown in FIG. 5, the transistors 50 to 59 constituting each of the pull up output buffers 41 are arranged in a Y direction. The transistor 50 has a configuration in which a plurality of transistors each including a source region S and a drain region D are formed on a semiconductor substrate, and a gate electrode G0 covering the semiconductor substrate located between the source region S and the drain region D are coupled in parallel to each other. Each of the transistors 51 to 53 includes a plurality of source regions S and a plurality of drain regions D alternately arranged in the Y direction, and a plurality of gate electrodes G1 to G3. There are differences in the number of the gate electrodes G1 to G3 and the capabilities of the transistors 51 to 53 are accordingly weighted. A series circuit constituted of the transistors 54 and 57 is realized by placing two gate electrodes G4 and G7 between a source region S and a drain region D. A series circuit constituted of the transistors 55 and 58 is realized by placing two gate electrodes G5 and G8 between a source region S and a drain region D. A series circuit constituted of the transistors 56 and 59 is realized by placing two gate electrodes G6 and G9 between a source region S and a drain region D. There are differences in the numbers of the gate electrodes G4 to G9 or the gate widths thereof and accordingly the capabilities of the series circuit constituted of the transistors 54 and 57, the series circuit constituted of the transistors 55 and 58, and the series circuit constituted of the transistors 56 and 59 are weighted. The source regions S and the drain regions D may be at the opposite locations to those shown in FIG. 5.

Figure 6:
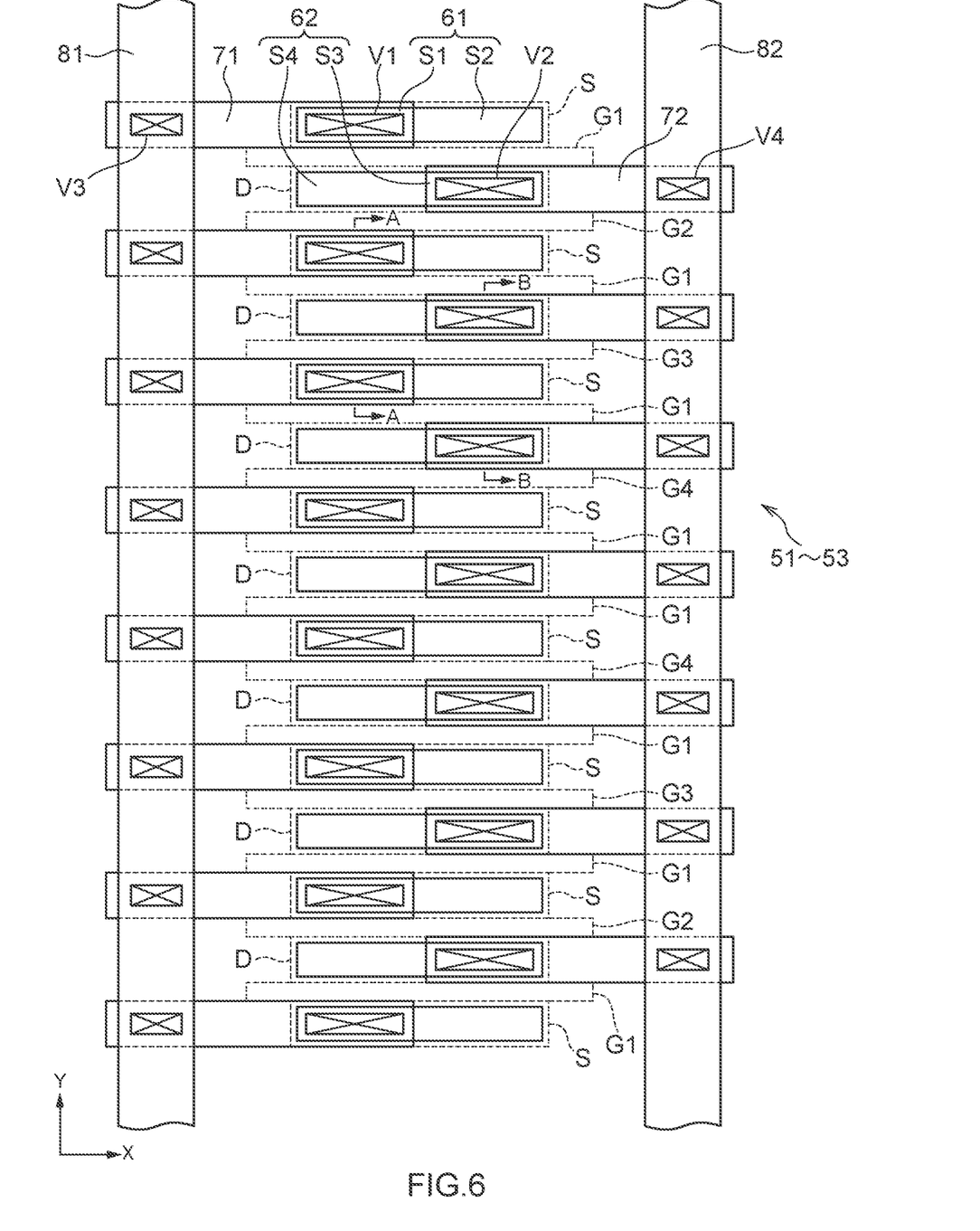
FIG. 6 is a layout diagram of lines coupled to source regions and drain regions.

FIG. 6 is a layout diagram of lines coupled to the source regions S and the drain regions of the transistors 51 to 53. In FIG. 6, the source regions S, the drain regions D, and the gate electrodes G1 to G3 constituting the transistors 51 to 53 are represented by broken lines. As shown in FIG. 6, each of the source regions S constituting the transistors 51 to 53 is covered with a conductive pattern 61, and each of the drain regions D constituting the transistors 51 to 53 is covered with a conductive pattern 62. The conductive patterns 61 and 62 are formed on a conductive layer M0 located in the lowermost layer. The conductive patterns 61 and 62 extend in the X direction similarly to the gate electrodes G1 to G3. Furthermore, a part of each of the conductive patterns 61 is covered with a conductive pattern 71 and a part of each of the conductive patterns 62 is covered with a conductive pattern 72. The conductive patterns 71 and 72 are formed on a conductive layer Li1 located above the conductive layer M0. The conductive patterns 71 and 72 also extend in the X direction. A via conductor V1 connecting an associated one of the conductive patterns 61 to an associated one of the conductive patterns 71 is provided at a location where the conductive pattern 61 and the conductive pattern 71 overlap with each other. A via conductor V2 connecting an associated one of the conductive patterns 62 to an associated one of the conductive patterns 72 is provided at a location where the conductive pattern 62 and the conductive pattern 72 overlap with each other. The conductive patterns 71 are coupled in common to a conductive pattern 81 extending in the Y direction. The conductive patterns 72 are coupled in common to a conductive pattern 82 extending in the Y direction. The conductive patterns 81 and 82 are formed on a conductive layer M1 located above the conductive layer Li1. A via conductor V3 connecting an associated one of the conductive patterns 71 to the conductive pattern 81 is provided at a location where the conductive pattern 71 and the conductive pattern 81 overlap with each other. A via conductor V4 connecting an associated one of the conductive patterns 72 to the conductive pattern 82 is provided at a location where the conductive pattern 72 and the conductive pattern 82 overlap with each other. The conductive patterns 81 and 82 may be arranged at locations overlapping with the source regions S and the drain regions D.

Figure 7:
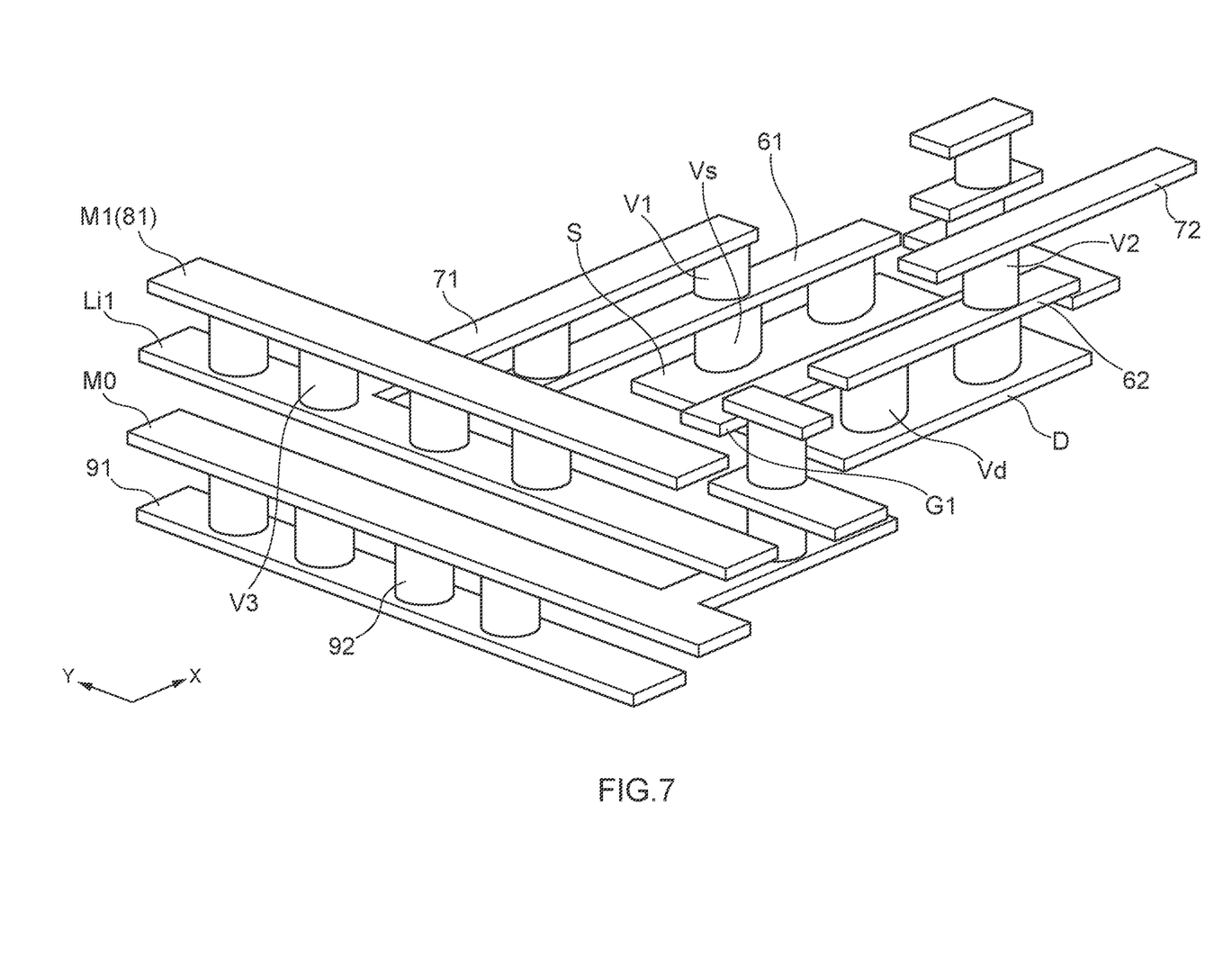
FIG. 7 is a schematic perspective view for explaining a positional relation among wiring layers.

FIG. 7 is a schematic perspective view for explaining a positional relation among the wiring layers. As shown in FIG. 7, in addition to the source regions S and the drain regions D, a well contact diffusion region 91 is provided on the semiconductor substrate. The conductive layer M0 is a conductive layer located in the lowermost layer provided on the semiconductor substrate. Conductive patterns formed on the conductive layer M0 extend in the X direction at least on formation regions of the transistors 50 to 59. However, some conductive patterns formed on the conductive layer M0, such as a conductive pattern for supplying a well potential to the well contact diffusion region 91 through via conductors 92, may extend in the Y direction. Among the conductive patterns formed on the conductive layer M0, the conductive patterns 61 each covering an associated one of the source regions S are coupled to the associated source regions S through via conductors Vs, respectively, and the conductive patterns 62 each covering an associated one of the drain regions D are coupled to the associated drain regions D through via conductors Vd, respectively. The conductive layer Li1 is a conductive layer located above the conductive layer M0. Conductive patterns formed on the conductive layer Li1 extend in the X direction at least on formation regions of the transistors 50 to 59. Some conductive patterns formed on the conductive layer Li1 may extend in the Y direction. Among the conductive patterns formed on the conductive layer Li1, the conductive patterns 71 each covering an associated one of the conductive patterns 61 are coupled to the associated conductive patterns 61 through the via conductors V1, respectively, and the conductive patterns 72 each covering an associated one of the conductive patterns 62 are coupled to the associated conductive patterns 62 through the via conductors V2, respectively. The conductive layer M1 is a conductive layer located above the conductive layer Li1. Conductive patterns formed on the conductive layer M1 mostly extend in the Y direction.

Each of the conductive patterns 71 covers a section S1 located on one side (the left side in FIG. 6) in the X direction of the associated conductive pattern 61 and does not cover a section S2 located on the other side (the right side in FIG. 6) in the X direction. Similarly, each of the conductive patterns 72 covers a section S3 located on one side (the right side in FIG. 6) in the X direction of the associated conductive pattern 62 and does not cover a section S4 located on the other side (the left side in FIG. 6) in the X direction. The sections S1 of the conductive patterns 61 are adjacent to the sections S4 of the conductive pattern 62 in the Y direction. The sections S2 of the conductive patterns 61 are adjacent to the sections S3 of the conductive patterns 62 in the Y direction. With this configuration, the length of parts adjacent in the Y direction in the conductive patterns 71 and the conductive patterns 72 is greatly reduced or the conductive patterns 71 and the conductive patterns 72 are prevented from being adjacent to each other in the Y direction. In the example shown in FIG. 6, the conductive pattern 71 and the conductive pattern 72 are not adjacent to each other in the Y direction. Therefore, the conductive patterns 71 are adjacent to each other in the Y direction with no conductive pattern 72 interposed therebetween, and the conductive patterns 72 are adjacent to each other in the Y direction with no conductive pattern 71 interposed therebetween. The via conductors V1 are arranged in the Y direction and the via conductors V2 are arranged in the Y direction. The center position of the via conductors V1 in the X direction and the center position of the via conductors V2 in the X direction are different from each other. Therefore, the via conductors V1 and V2 are arranged in a zigzag manner.

Figure 8A:
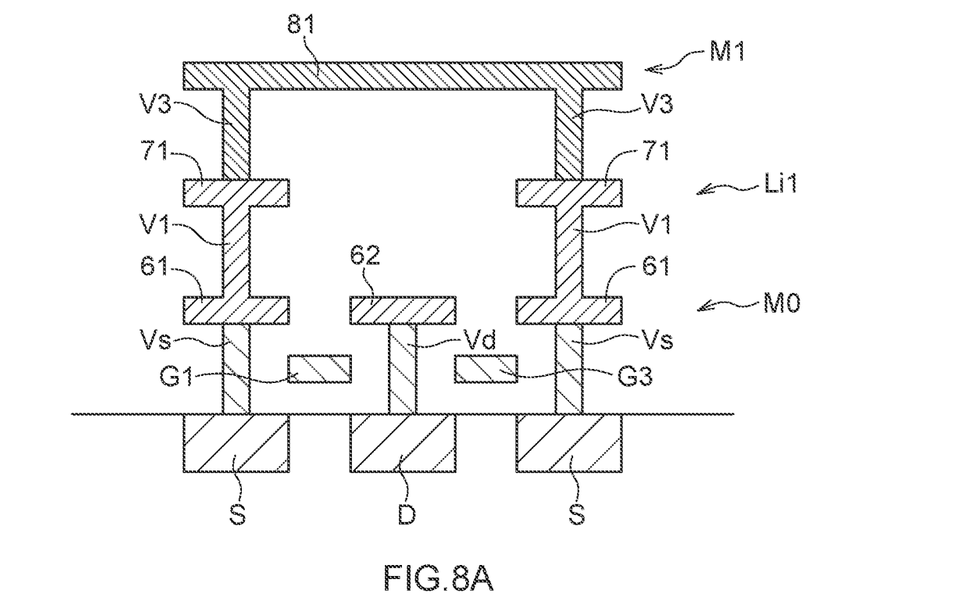
FIG. 8A is a schematic sectional view along a line A-A shown in FIG. 6.
Figure 8B:
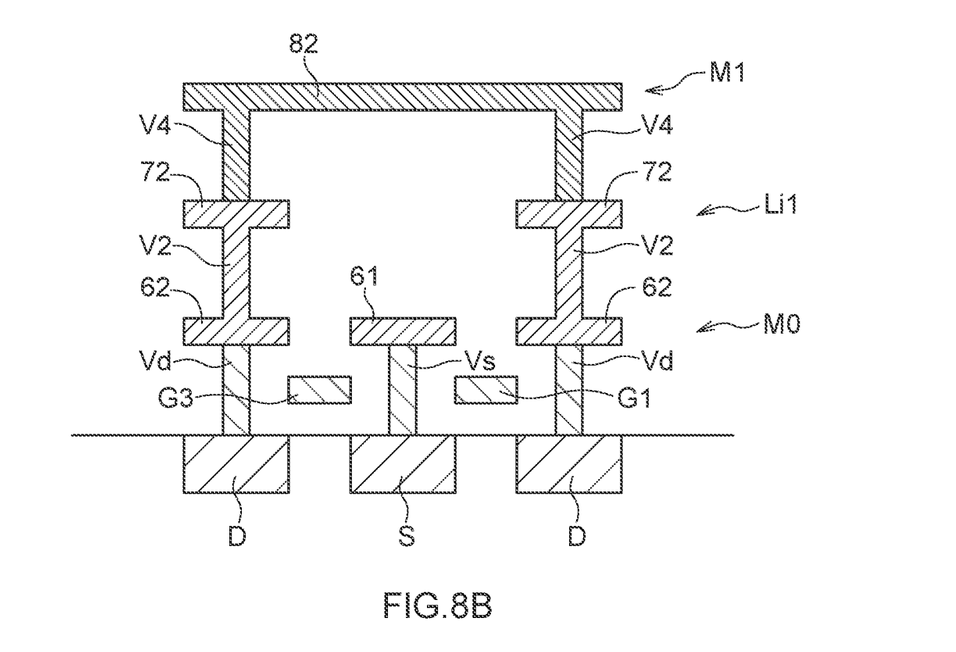
FIG. 8B is a schematic sectional view along a line B-B shown in FIG. 6.

As a result, since there is no conductive pattern 72 immediately above each of the conductive patterns 62 in a cross-section along a line A-A shown in FIG. 6, as shown in FIG. 8A, the capacitance is reduced compared to a case in which there is a conductive pattern 72 immediately above each of the conductive patterns 62 in the cross-section along the line A-A. Furthermore, even when the conductive pattern 81 is provided in the cross-section along the line A-A as in the example shown in FIG. 8A, the capacitance between the conductive patterns 72 and the conductive pattern 81 is also reduced because there is no conductive pattern 72 immediately below the conductive pattern 81. Similarly, since there is no conductive pattern 71 immediately above each of the conductive patterns 61 in a cross-section along a line B-B shown in FIG. 6, as shown in FIG. 8B, the capacitance is reduced compared to a case in which there is the conductive pattern 71 immediately above each of the conductive patterns 61 in the cross-section along the line B-B. Furthermore, even when the conductive pattern 82 is provided in the cross-section along the line B-B as in the example shown in FIG. 8B, the capacitance between the conductive patterns 71 and the conductive pattern 82 is also reduced because there is no conductive pattern 71 immediately below the conductive pattern 82.

Figure 9:
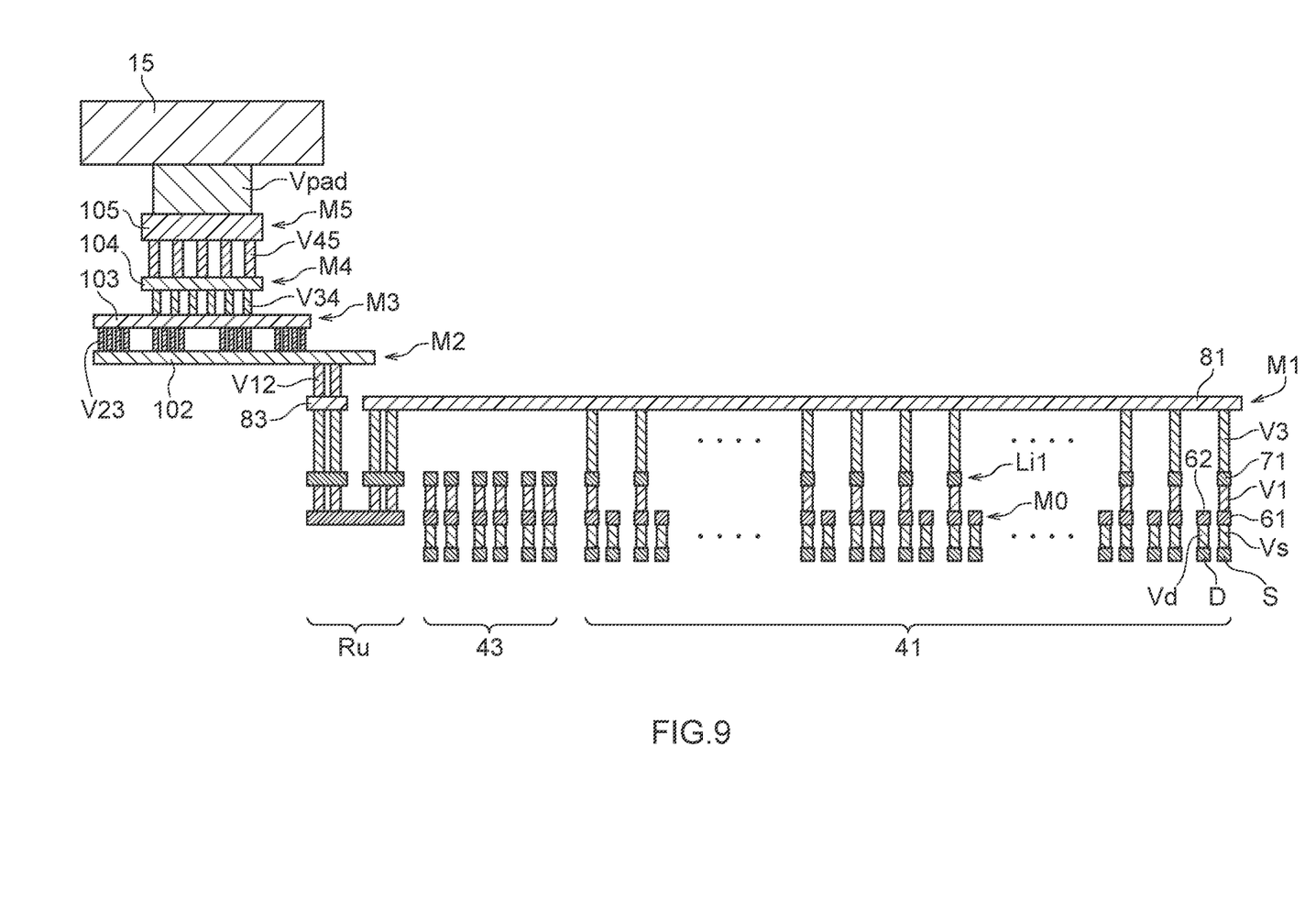
FIG. 9 is a schematic sectional view for explaining a coupling path between each of the pull up output buffers and one of the data I/O terminals

FIG. 9 is a schematic sectional view for explaining a coupling path between each of the pull up output buffers 41 and one of the data I/O terminals 15. As shown in FIG. 9, the source regions S of the transistors 50 to 59 constituting the pull up output buffer 41 are coupled to the conductive pattern 81 located on the conductive layer M1 through the associated via conductors Vs, the associated conductive patterns 61, the associated via conductors V1, the associated conductive patterns 71, and the associated via conductors V3, respectively. In the cross-section shown in FIG. 9, the conductive patterns 72 and the via conductors V2 coupled to the drain regions D are omitted. The conductive pattern 81 is coupled to a conductive pattern 83 located on the conductive layer M1 through the pull up resistor Ru. The conductive pattern 83 is coupled to a conductive pattern 102 located on a conductive layer M2 through via conductors V12. The conductive pattern 102 is coupled to a conductive pattern 103 located on a conductive layer M3 through via conductors V23. The conductive pattern 103 is coupled to a conductive pattern 104 located on a conductive layer M4 through via conductors V34. The conductive pattern 104 is coupled to a conductive pattern 105 located on a conductive layer M5 through via conductors V45. The conductive pattern 105 is coupled to the data I/O terminal 15 through via conductors Vpad. A wiring layer in the uppermost layer where the data I/O terminals 15 are formed may be an iRDL (inline redistribution layer).

While the transistors 50 to 59 constituting each of the pull up output buffers 41 are explained above, the same holds for the transistors 60 to 69 constituting each of the pull down output buffers 42. Since this reduces the capacitance produced between the source and drain of each of the transistors 50 to 59 and the capacitance produced between the source and drain of each of the transistors 60 to 69, the capacitance added to the data I/O terminals 15 is reduced. As a result, the transfer rate for input/output data can be increased and the current consumption associated with input/output of data can be lowered.

Although various embodiments have been disclosed in the context of certain preferred embodiments and examples, it will be understood by those skilled in the art that the scope of the present disclosure extend beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying mode of the disclosed invention. Thus, it is intended that the scope of at least some of the present disclosure should not be limited by the particular disclosed embodiments described above.

The invention claimed is:

1. An apparatus, comprising:
a semiconductor substrate having a first source region, a first channel region, and a first drain region arranged in a first direction;
a first gate electrode extending in a second direction perpendicular to the first direction and covering the first channel region;
a first wiring layer including first and second conductive patterns extending in the second direction and coupled to the first source region and the first drain region, respectively, wherein the first conductive pattern extends along the first gate electrode in the second direction and covers the first source region, and the second conductive pattern extends along the first gate electrode in the second direction and covers the first drain region; and
a second wiring layer located over the first wiring layer, the second wiring layer including third and fourth conductive patterns extending in the second direction and coupled to the first and second conductive patterns, respectively, wherein the first conductive pattern has first and second sections arranged in the second direction, wherein the second conductive pattern has third and fourth sections arranged in the second direction, wherein the first and fourth sections are arranged in the first direction, wherein the second and third sections are arranged in the first direction, wherein the third conductive pattern covers the first section of the first conductive pattern without covering the second section of the first conductive pattern, and wherein the fourth conductive pattern covers the third section of the second conductive pattern without covering the fourth section of the second conductive pattern.

2. The apparatus of claim 1, wherein the third conductive pattern and the fourth conductive pattern do not overlap each other in the first direction.

3. The apparatus of claim 1, further comprising a data I/O terminal coupled to one of the first source region and the first drain region.

4. The apparatus of claim 3, further comprising a power supply terminal coupled to the other of the first source region and the first drain region.

5. An apparatus, comprising:
a semiconductor substrate having a first source region, a first channel region, and a first drain region arranged in a first direction;
a first gate electrode extending in a second direction perpendicular to the first direction and covering the first channel region;
a first wiring layer including first and second conductive patterns extending in the second direction and coupled to the first source region and the first drain region, respectively; and
a second wiring layer located over the first wiring layer, the second wiring layer including third and fourth conductive patterns extending in the second direction and coupled to the first and second conductive patterns, respectively,
wherein the first conductive pattern has first and second sections arranged in the second direction,
wherein the second conductive pattern has third and fourth sections arranged in the second direction,
wherein the first and fourth sections are arranged in the first direction,
wherein the second and third sections are arranged in the first direction,
wherein the third conductive pattern covers the first section of the first conductive pattern without covering the second section of the first conductive pattern,
wherein the fourth conductive pattern covers the third section of the second conductive pattern without covering the fourth section of the second conductive,
wherein the apparatus further comprises:
a first via conductor connecting the third conductive pattern to the first conductive pattern; and
a second via conductor connecting the fourth conductive pattern to the second conductive pattern, and
wherein the first and second via conductors are not arranged in the first direction.

6. An apparatus, comprising:
a semiconductor substrate having a first source region, a first channel region, and a first drain region arranged in a first direction;
a first gate electrode extending in a second direction perpendicular to the first direction and covering the first channel region;
a first wiring layer including first and second conductive patterns extending in the second direction and coupled to the first source region and the first drain region, respectively; and
a second wiring layer located over the first wiring layer, the second wiring layer including third and fourth conductive patterns extending in the second direction and coupled to the first and second conductive patterns, respectively,
wherein the first conductive pattern has first and second sections arranged in the second direction,
wherein the second conductive pattern has third and fourth sections arranged in the second direction,
wherein the first and fourth sections are arranged in the first direction,
wherein the second and third sections are arranged in the first direction,
wherein the third conductive pattern covers the first section of the first conductive pattern without covering the second section of the first conductive pattern,
wherein the fourth conductive pattern covers the third section of the second conductive pattern without covering the fourth section of the second conductive,
wherein the semiconductor substrate further has a second source region and a second channel region, the first drain region, the second channel region, and the second source region being arranged in the first direction,
wherein the apparatus further comprises a second gate electrode extending in the second direction and covering the second channel region,
wherein the first wiring layer further includes a fifth conductive pattern extending in the second direction and coupled to the second source region,
wherein the second wiring layer further includes a sixth conductive pattern extending in the second direction and coupled to the fifth conductive pattern,
wherein the fifth conductive pattern has fifth and sixth sections arranged in the second direction,
wherein the fourth and fifth sections are arranged in the first direction,
wherein the third and sixth sections are arranged in the first direction, and
wherein the sixth conductive pattern covers the fifth section of the fifth conductive pattern without covering the sixth section of the fifth conductive pattern.

7. The apparatus of claim 6, wherein the third and sixth conductive patterns are adjacent to each other in the first direction without the fourth conductive pattern interposed therebetween.

8. The apparatus of claim 6, further comprising a third wiring layer located over the second wiring layer,
wherein the third wiring layer includes a seventh conductive pattern extending in the first direction and coupled in common to the third and sixth conductive patterns.

9. The apparatus of claim 8,
wherein the semiconductor substrate further has a second drain region and a third channel region, the second source region, the third channel region, and the second drain region being arranged in the first direction,
wherein the apparatus further comprises a third gate electrode extending in the second direction and covering the third channel region, wherein the first wiring layer further includes an eighth conductive pattern extending in the second direction and coupled to the second drain region, wherein the second wiring layer further includes a ninth conductive pattern extending in the second direction and coupled to the eighth conductive pattern, wherein the eighth conductive pattern has seventh and eighth sections arranged in the second direction, wherein the fifth and eighth sections are arranged in the first direction, wherein the sixth and seventh sections are arranged in the first direction, and wherein the ninth conductive pattern covers the seventh section of the eighth conductive pattern without covering the eighth section of the eighth conductive pattern.

10. The apparatus of claim 9, wherein the fourth and ninth conductive patterns are adjacent to each other in the first direction without the sixth conductive pattern interposed therebetween.

11. The apparatus of claim 9, wherein the third wiring layer further includes a tenth conductive pattern extending in the first direction and coupled in common to the fourth and ninth conductive patterns.

\* \* \* \* \*